(12) United States Patent
Chandra et al.

(10) Patent No.: US 7,191,413 B2
(45) Date of Patent: Mar. 13, 2007

(54) METHOD AND APPARATUS FOR THERMAL TESTING OF SEMICONDUCTOR CHIP DESIGNS

(75) Inventors: Rajit Chandra, Cupertino, CA (US); Lucio Lanza, Palo Alto, CA (US)

(73) Assignee: Gradient Design Automation, Inc., Santa Clara, CA (US)

( * ) Notice: Subject to any disclaimer, the term of this patent is extended or adjusted under 35 U.S.C. 154(b) by 43 days.

(21) Appl. No.: 11/078,047

(22) Filed: Mar. 11, 2005

(65) Prior Publication Data

US 2005/0166166 A1 Jul. 28, 2005

Related U.S. Application Data

(63) Continuation-in-part of application No. 10/979,957, filed on Nov. 3, 2004.

(60) Provisional application No. 60/552,375, filed on Mar. 11, 2004, provisional application No. 60/539,727, filed on Jan. 28, 2004.

(51) Int. Cl.
*G06F 17/50* (2006.01)

(52) U.S. Cl. .................................. 716/4; 716/6; 716/5
(58) Field of Classification Search ................. 716/4–6
See application file for complete search history.

(56) References Cited

U.S. PATENT DOCUMENTS

| | | | | |
|---|---|---|---|---|
| 4,696,578 | A * | 9/1987 | Mansuria et al. | 374/45 |
| 5,838,578 | A * | 11/1998 | Pippin | 716/4 |
| 5,927,853 | A * | 7/1999 | Christiaens et al. | 374/43 |
| 5,997,174 | A * | 12/1999 | Wyland | 374/43 |
| 6,203,191 | B1 * | 3/2001 | Mongan | 374/43 |
| 2002/0050833 | A1 * | 5/2002 | Jones et al. | 324/760 |

OTHER PUBLICATIONS

"Design Flow", Carleton University, Copyright John Knight, Revised; Sep. 30, 2003, pp. 1-22.
"Stratix II High-Speed Development Board", Data Sheet, Altera Corporation, Sep. 2004, ver. 1.0, pp. 1-85.
Wang, Ting-Yuan, et al., "Thermal-ADI-A Linear-Time Chip-Level Dynamic Thermal-Simulation Algorithm Based on Alternating-Direction-Implicit (ADI) Method", IEEE Transactions on Very Large Scale Integration (VLSI) Systems, vol. 11, No. 4, dated Aug. 4, 2003, pp. 691-700.
Wang, Ting-Yuan, et al., "3D Thermal-ADI- An Efficient Chip-Level Transient Thermal Simulator", ISPD'03, Apr. 6-9, 2003, Monterey, California, USA http://www.ece.wisc.edu/~vlsi/research/ISPD2003_p005-wang.pdf, Copy consists of "8" unnumbered pages.
Wang, Ting-Yuan, et al., "3-D Thermal-ADI: A linear-Time Chip Level Transient Thermal Simulator", IEEE Transactions on Computer-Aided Design of Integrated Circuits and Systems, vol. 21, No. 12, dated Dec. 2002, pp. 1434-1445.
Wang, Ting-Yuan, et al., "Thermal-ADI: A Linear-Time Chip-Level Dynamic Thermal Simulation Algorithm Based on Alternating-Direction-Implicit (ADI) Method", ISPD'01, Apr. 1-4, 2001, Sonoma, California, USA http://www.ece.wisc.edu/~vlsi/research/ISPD2001_wang.pdf , Copy consists of "6" unnumbered pages.

* cited by examiner

*Primary Examiner*—Jack Chiang
*Assistant Examiner*—Binh Tat
(74) *Attorney, Agent, or Firm*—Kin-Wah Tong, Esq.; Patterson & Sheridan, LLP

(57) ABSTRACT

A method and apparatus for thermal testing of semiconductor chip designs is provided. One embodiment of a novel method for performing thermal testing of a semiconductor chip design includes calculating full-chip temperatures over the semiconductor chip design (e.g., to identify steep thermal gradients) and positioning temperature sensors within a corresponding semiconductor chip in accordance with the calculated full-chip temperatures (e.g., in the regions of steep thermal gradients). Thus, temperature sensors are strategically placed in the regions where they are most likely to be needed, according to calculated temperatures, rather than randomly positioned throughout a test chip.

11 Claims, 7 Drawing Sheets

METHOD AND APPARATUS FOR THERMAL TESTING OF SEMICONDUCTOR CHIP DESIGNS

CROSS-REFERENCE TO RELATED APPLICATIONS

This application claims the benefit of U.S. Provisional Patent Application No. 60/552,375, filed Mar. 11, 2004 (entitled "Method And Apparatus For Insertion Of Test Structures In Integrated Circuit Designs Using Temperature Gradient Data"), which is herein incorporated by reference in its entirety. This application is also a continuation-in-part of U.S. patent application Ser. No. 10/979,957, filed Nov. 3, 2004 (entitled "Method And Apparatus For Full-Chip Analysis Of Semiconductor Chip Designs") and claiming priority to U.S. Provisional Patent Application No. 60/539,727, filed Jan. 28, 2004 (entitled "Method and Apparatus for Improving Constant Temperature Based Timing Analysis of Integrated Circuits By Using Computed Thermal Gradients"), both of which are herein incorporated by reference in their entireties.

FIELD OF THE INVENTION

The present invention generally relates to semiconductor chip design, and more particularly relates to the thermal analysis of semiconductor chip designs.

BACKGROUND OF THE INVENTION

Semiconductor chips typically comprise the bulk of the components in an electronic system. These semiconductor chips are also often the hottest part of the electronic system, and failure of the system can often be traced back to thermal overload on the chips. As such, thermal management is a critical parameter of semiconductor chip design.

FIG. 1 is a schematic diagram illustrating an exemplary semiconductor chip 100. As illustrated, the semiconductor chip 100 comprises one or more semiconductor devices 102a–102n (hereinafter collectively referred to as "semiconductor devices 102"), such as transistors, resistors, capacitors, diodes and the like deposited upon a substrate 104 and coupled via a plurality of wires or interconnects 106a–106n (hereinafter collectively referred to as "interconnects 106"). These semiconductor devices 102 and interconnects 106 share power, thereby distributing a thermal gradient over the chip 100 that may range from 100 to 180 degrees Celsius in various regions of the chip 100.

It is particularly important, when designing semiconductor chips, to determine whether such thermal gradients are within the bounds of a chip's operational limits (e.g., to ensure that a chip constructed in accordance with a given design will not overheat and trigger a failure when deployed for use). Conventional methods for testing temperatures within a semiconductor chip involve inserting temperature sensors (e.g., thermometers, thermistors, diode structures and the like), at locations of interest within a "dummy" or test chip. However, because the locations where steep thermal gradients may occur in the actual chip are not typically known at the time of design, the value of information learned through this random method is limited (e.g., the steepest thermal gradients may be missed and unaccounted for).

Therefore, there is a need in the art for a method and apparatus for thermal testing of semiconductor chip designs.

SUMMARY OF THE INVENTION

A method and apparatus for thermal testing of semiconductor chip designs is provided. One embodiment of a novel method for performing thermal testing of a semiconductor chip design includes calculating full-chip temperatures over the semiconductor chip design (e.g., to identify steep thermal gradients) and positioning temperature sensors within a corresponding semiconductor chip in accordance with the calculated full-chip temperatures (e.g., in the regions of steep thermal gradients). Thus, temperature sensors are strategically placed in the regions where they are most likely to be needed, according to calculated temperatures, rather than randomly positioned throughout a test chip.

BRIEF DESCRIPTION OF THE DRAWINGS

So that the manner in which the above recited embodiments of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures.

DETAILED DESCRIPTION

Embodiments of the invention generally provide a method and apparatus for thermal testing of semiconductor chip designs. One embodiment of the inventive method produces a full-chip (e.g., three-dimensional) solution of temperature values within a chip design (e.g., including power dissipation values distributed over semiconductor devices such as transistors, resistors, capacitors and diodes and over wire interconnects), prior to inserting temperature sensors within an operational (e.g., under fully functional operation) chip. This provides chip designers with a more accurate indication of where the thermal gradients occur, thereby improving the placement of temperature sensors in the chip.

As used herein, the term "semiconductor chip" refers to any type of semiconductor chip, which might employ analog and/or digital design techniques and which might be fabricated in a variety of fabrication methodologies including, but not limited to, complementary metal-oxide semiconductor (CMOS), bipolar complementary metal-oxide semiconductor (BiCMOS), and gallium arsenide (GaAs) methodologies. Furthermore, as used herein, the term "semiconductor device" refers to a potential active heat dissipating device in a semiconductor chip, including, but not limited to, transistors, resistors, capacitors, diodes and inductors. The terms "wire", "interconnect" or "wire interconnect" as used herein refer to any of various means of distributing electrical signals (which may be analog or digital, static or dynamic, logic signals or power/ground signals) from one place to another. "Interconnects" may be on a semiconductor chip itself, used in the packaging of the semiconductor chip, deployed between the semiconductor chip and the packaging, or used in a variety of other ways. The term "temperature sensor", as used herein, refers to any device or temperature scale that is capable of indicating, directly or indirectly, the current temperature of an object to which it is applied, including a thermometer circuit, a diode and a thermistor.

Figure 1:
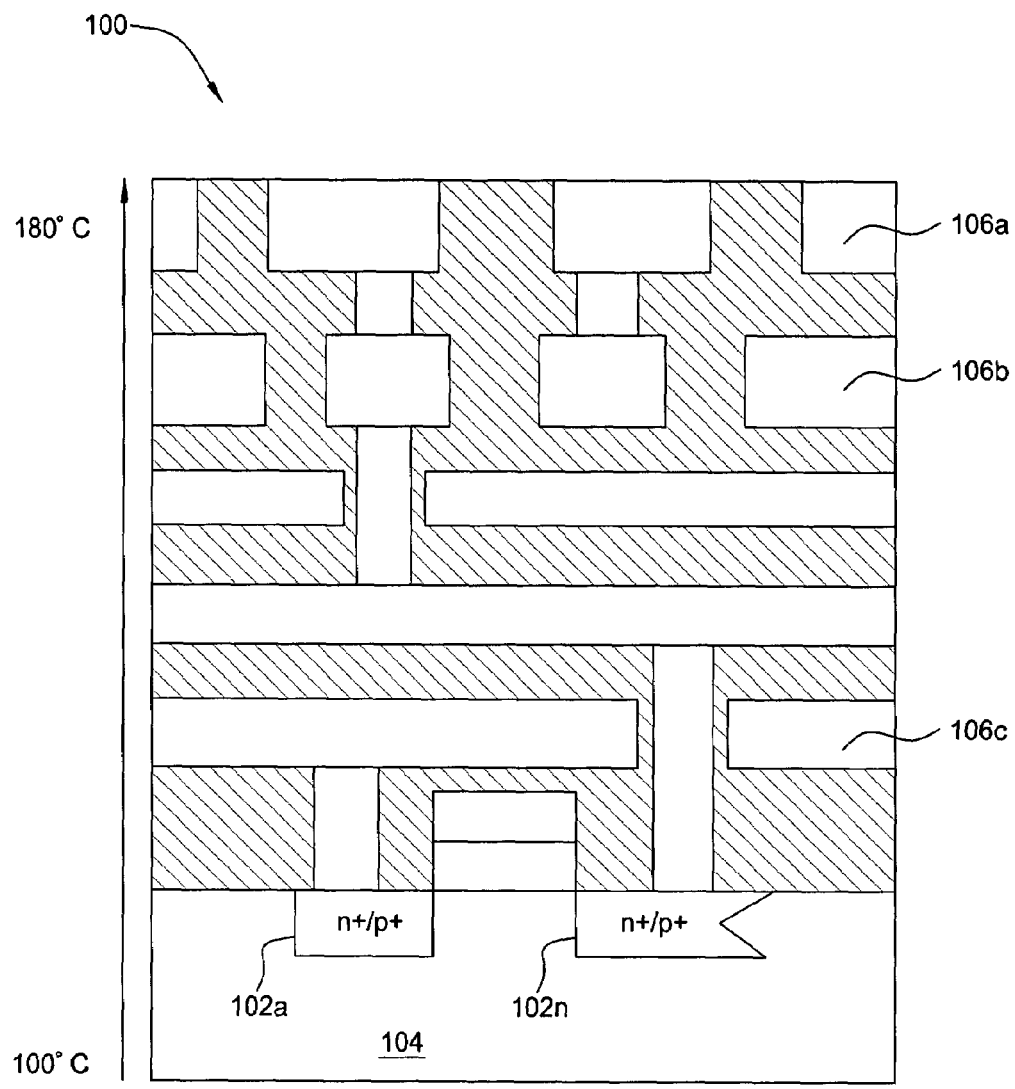
FIG. 1 is a schematic diagram illustrating an exemplary semiconductor chip.
Figure 2:
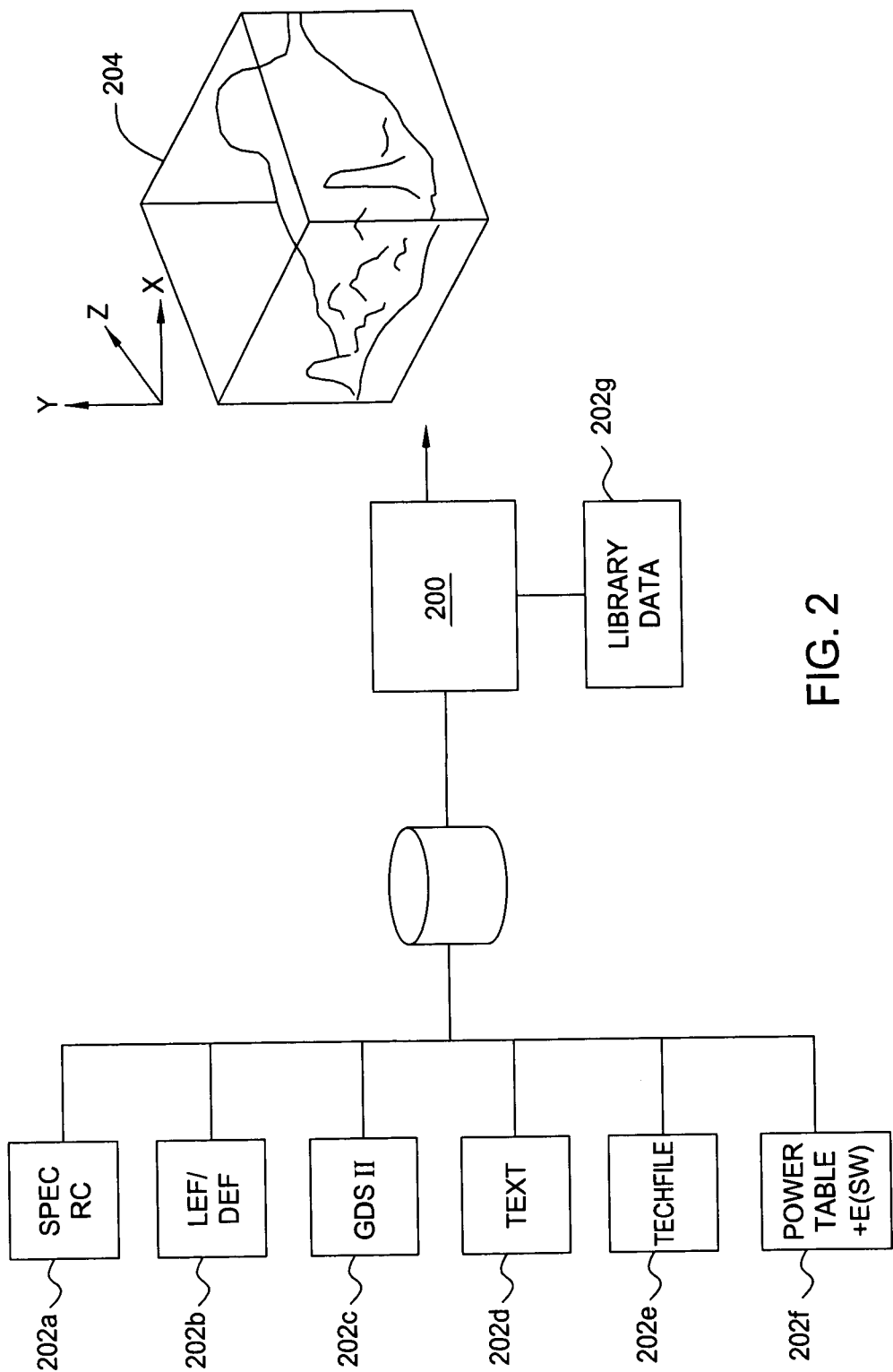
FIG. 2 is a schematic diagram illustrating one implementation of a thermal analysis tool according to the present invention.

FIG. 2 is a schematic diagram illustrating one implementation of a thermal analysis tool 200 according to the present invention. As illustrated, the thermal analysis tool 200 is adapted to receive a plurality of inputs 202a-202g (hereinafter collectively referred to as "inputs 202") and process these inputs 202 to produce a full-chip (e.g., three-dimensional) thermal model 204 of a proposed semiconductor chip design.

In one embodiment, the plurality of inputs 202 includes industry standard design data 202a–202f (e.g., pertaining to the actual chip design or layout under consideration) and library data 202g (e.g., pertaining to the semiconductor devices and interconnects incorporated in the design). In one embodiment, the industry standard design data includes one or more of the following types of data: electrical component extraction data and extracted parasitic data (e.g., embodied in standard parasitic extraction files, or SPEFs, 202a), design representations including layout data (e.g., embodied in Library Exchange Format/Design Exchange Format, or LEF/DEF files 202b, Graphical Design Format II, or GDSII, files 202c and/or text files 202d), manufacturer-specific techfiles 202e describing layer information and package models, user-generated power tables 202f including design data (e.g., including a switching factor, E(sw)). In one embodiment, this industry standard design data 202a–202f is stored in a design database such as an open access database or a proprietary database. In one embodiment, the library data 202g is embodied in a library that is distributed by a semiconductor part manufacturer or a library vendor. In another embodiment, the library incorporating the library data 202g can be built in-house by a user.

In one embodiment, the library data 202g includes transistor and diode models that are used to characterize the transistor resistances ($R_{dv}$) of the driver circuits, e.g., such as models available through Berkeley short-channel Insulated Gate Field Effect Transistor (IGFET) model (BSIM) models used by circuit simulators including Simulation Program with Integrated Circuit Emphasis (SPICE), HSPICE, commercially available from Synopsys, Inc. of Mountain View, Calif. and Heterogeneous Simulation Interoperability Mechanism (HSIM, commercially available from Nassda Corporation of Santa Clara, Calif.), all developed at the University of California at Berkeley.

As mentioned above, the plurality of inputs 202 are provided to the thermal analysis tool 200, which processes the data in order to produce a full-chip thermal model 204 of a proposed semiconductor chip design. In one embodiment, the full-chip thermal model is a three-dimensional thermal model.

Thus, as described above, embodiments of the present invention rely on library data representing the electrical properties of a semiconductor chip design (e.g., the resistance and capacitance at various points) and the manners in which these properties may vary with respect to each other and with respect to other phenomena (e.g., temperature or fabrication variations). Those skilled in the art will appreciate that these electrical properties may be specified or calculated in any number of ways, including, but not limited to, table-driven lookups, formulas based on physical dimensions, and the like.

Figure 3:
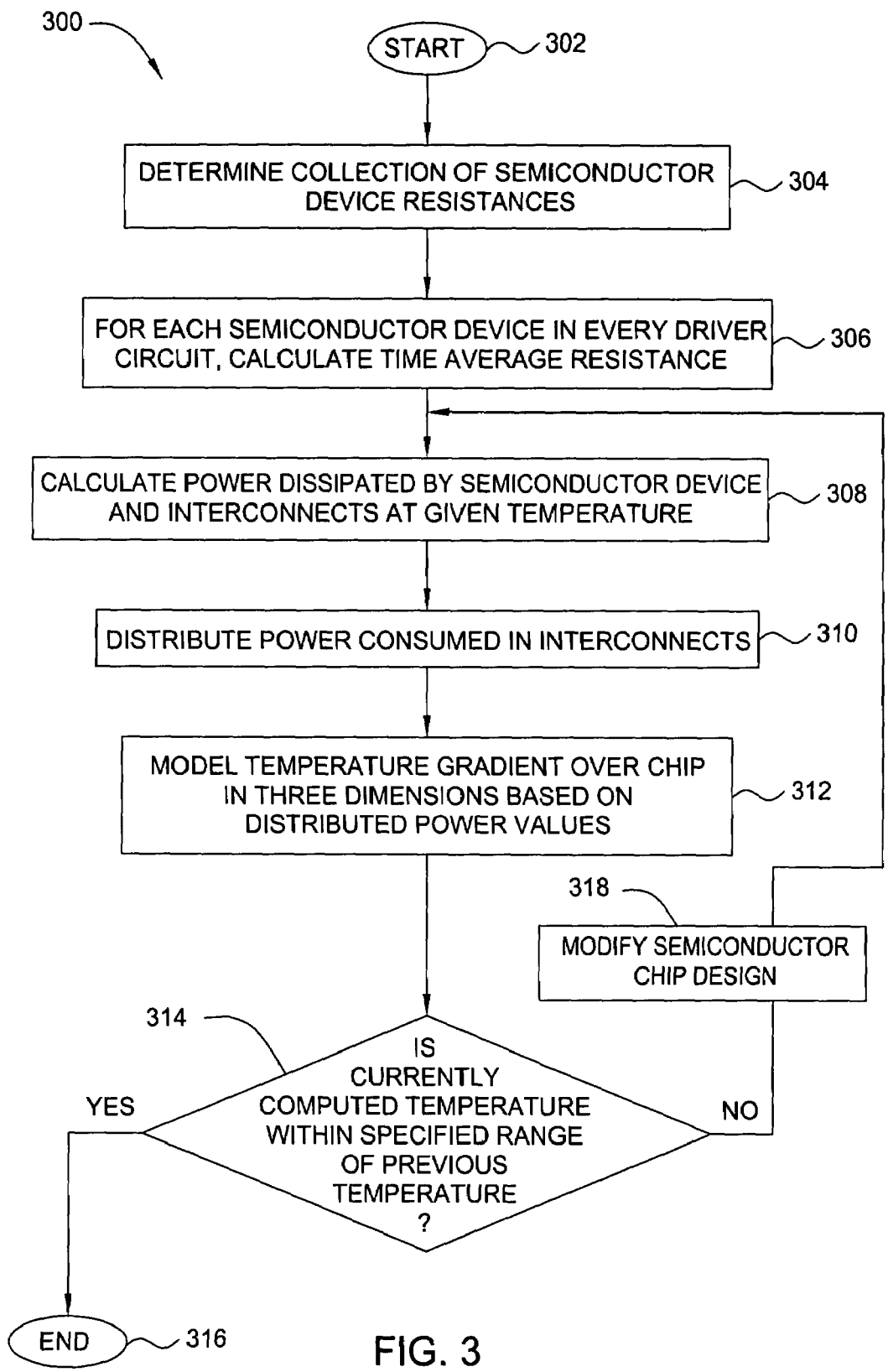
FIG. 3 is a flow diagram illustrating one embodiment of a method for performing three-dimensional thermal analysis of a semiconductor chip design according to the present invention.

FIG. 3 is a flow diagram illustrating one embodiment of a method 300 for performing full-chip thermal analysis of a semiconductor chip design according to the present invention. The method 300 is only one exemplary embodiment of a method for performing full-chip thermal analysis according to the present invention; the present invention is not limited by the specific examples described herein. The method 300 may be implemented, for example, in the thermal analysis tool 200 illustrated in FIG. 2. In one embodiment, the method 300 relies on the computation of power dissipated by various semiconductor devices of the semiconductor chip design. As will be apparent from the following discussion, this power computation may be performed in any number of ways, including, but not limited to, table-driven lookups, computations based on electrical properties, circuit simulations, and the like. Moreover, those skilled in the art will appreciate that although the following description discusses the effects of resistance on power dissipation, power dissipation computations could be based on any number of other electrical properties or parameters, including, but not limited to, capacitance, inductance and the like. Moreover, the computations could be static or dynamic.

The method 300 is initialized at step 302 and proceeds to step 304, where the method 300 determines the collection of semiconductor devices (e.g., transistor, resistors, capacitors, diodes inductors and the like) and their resistances. In one embodiment, the method 300 determines this information by reading one or more of the chip layout data (e.g., in GDS II, DEF and/or text format), layer and package model data (e.g., from one or more techfiles), and initial power and power versus temperature data for the semiconductor devices (e.g., from the library data). In one embodiment, initial power values and power values as a function of temperature may be recorded within a common power table for acceptable operating ranges for the driver circuits within the chip design. The driver circuits may be at semiconductor device level or at cell level, where cell level circuits represent an abstraction of interconnected semiconductor devices making up a known function.

In step 306, the method 300 uses the information collected in step 304 to calculate the time average resistance values for every semiconductor device in every driver circuit of the chip design, as well as for every diode junction. These time-average resistance values relate to changes in semiconductor device dimensions (e.g., such as using higher power transistors in place of lower power transistors in a chip design). In one embodiment, the time average resistance value, $R_{average}$ for a semiconductor device is calculated as:

$$R_{average} = \frac{\int_0^{t_r} Rdv(t)dt}{t_r} \quad \text{(EQN. 1)}$$

where $t_r$ is the output transition time of the driver circuit under consideration, e.g., as specified by the library data.

Figure 4:
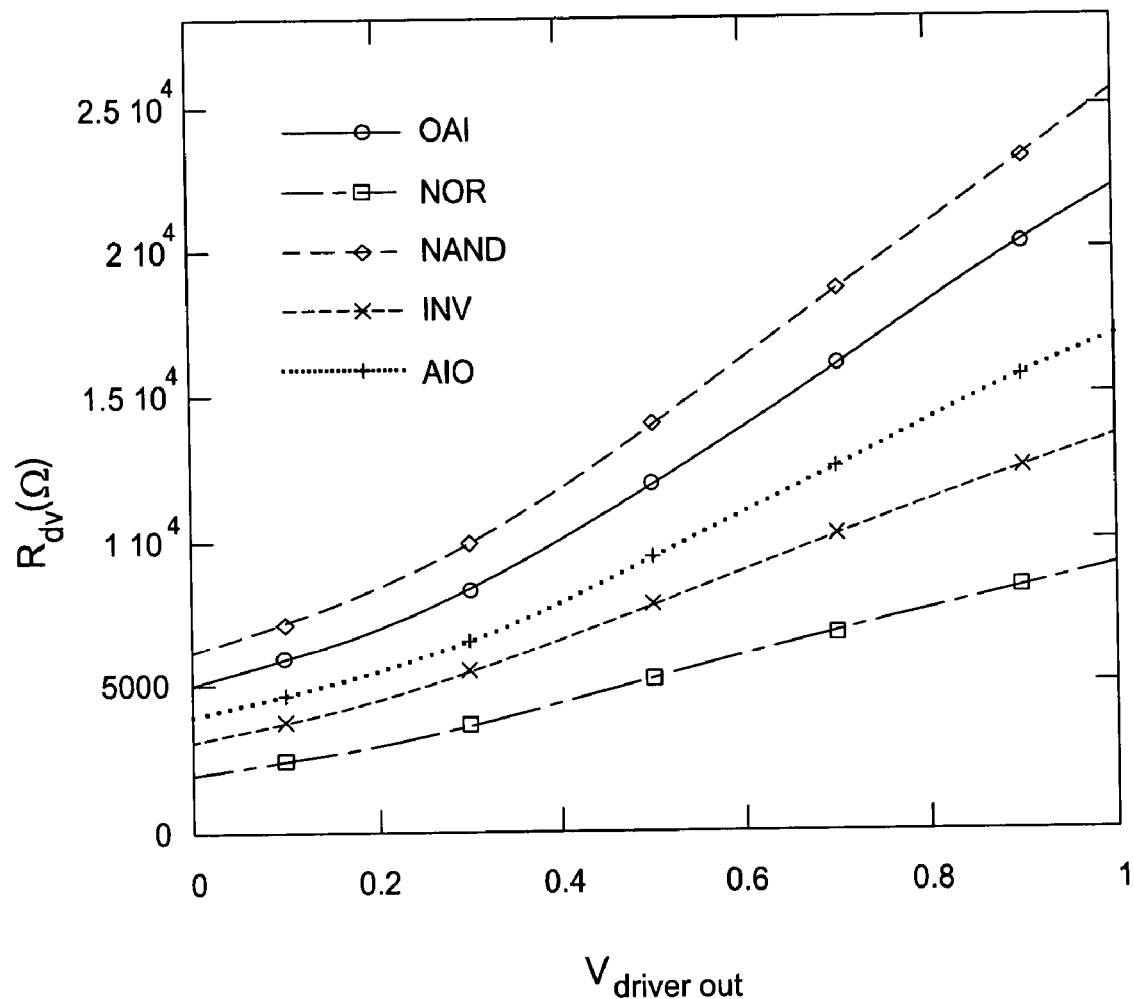
FIG. 4 is a graph illustrating the change in value of transistor resistance for an exemplary negative channel metal oxide semiconductor as a function of the output transition voltage.

FIG. 4 is a graph illustrating the change in value of transistor resistance, $R_{dv}$, for an exemplary negative channel metal oxide semiconductor (nMOS) as a function of the output transition voltage, $V_{driver\_out}$. As illustrated, the power dissipated by a transistor varies during switching. This is also true for the power dissipated in other semiconductor devices and in the interconnects coupled to the semiconductor devices on the chip.

Referring back to FIG. 3, in step 308, the method 300 calculates the power dissipated by the semiconductor devices and interconnects at a given temperature for the design under consideration. In one embodiment of step 308, e.g., where a steady-state analysis of the chip design is being performed, the interdependence of temperature and average power is captured through pre-characterized parameters of the semiconductor devices and interconnects. In one embodiment, the power dissipated by a semiconductor device (in this exemplary case, a transistor), $P_{transistor}$, is calculated as:

$$P_{transistor} = (V_d)^2 / R_{average} \quad \text{(EQN. 2)}$$

where $V_d$ is the power supply voltage supplied to the transistor. This voltage, $V_d$, is less than the actual power supply voltage, $V_{dd}$, as the current drawn by the transistors and flowing through the interconnects that connect the transistors to a power supply causes a voltage drop. In another embodiment, the power supply voltage to the transistor $V_d$ could be divided by the maximum or minimum resistance value, $R_{max}$ or $R_{min}$, in order to calculate the power dissipated in the transistor. In one embodiment, a decision as to whether to use an average, minimum or maximum resistance value to calculate $P_{transistor}$ is based at least in part on whether additional conditions, such as the operation of the circuit, are to be evaluated.

While equations for calculating the power dissipation of transistors have been provided herein by way of example, those skilled in the art will appreciate that various methods of calculating power dissipation for other semiconductor devices, such as resistors, capacitors and diodes, are known in the art. For example, equations for calculating the power dissipation of a resistor are discussed in the Proceedings of the Fourth International Symposium on Quality Electronic Design (ISQED 2003), Mar. 24–26, 2003, San Jose, Calif.

In one embodiment, the power dissipated by the interconnects (e.g., power and signal lines), $P_{interconnect}$ is calculated as:

$$P_{interconnect} = P - P_{transistor} \quad \text{(EQN. 3)}$$

where P is the average electrical power dissipated per clock cycle by a digital circuit (e.g., the chip design under consideration; for the full chip, the total P is the sum of the power dissipated by each circuit in the chip) and is available from the library data 202g. In the power lines, power is typically dissipated as Joule heating, where the dissipated power $P_{dissipated}$ may be calculated as:

$$P_{dissipated} = I_p^2 R_{power} \quad \text{(EQN. 4)}$$

where $I_p$ is the current through the power lines and $R_{power}$ is the resistance of the power bus. The value of Ip may be calculated by commercially available tools, such as Voltage Storm, available from Cadence Design Systems, Inc. of San Jose, Calif.

Typically, the power drawn by a switching transistor may be calculated as:

$$P = C_{load} V_{dd} E(sw)(fclk) \quad \text{(EQN. 5)}$$

where $C_{load}$ is the output capacitance as seen by the circuit, E(sw) is the switching activity as defined by the average number of output transitions per clock period, and fclk is the clock frequency. The switching factor or acrivity, E(sw), is used for evaluating the power table for the initial state of the design. $C_{load}$ may be calculated by parasitic extraction tools, and values for fclk and $V_{dd}$ are typically specified for a given design. In general, half of the power, P, is stored in the capacitance and the other half is dissipated in the transistors and interconnects (e.g., the power and signal lines). Those skilled in the art will appreciate that since $R_{average}$ varies with the transition time of the circuits, and as the switching activity changes for different modes of operation, E(sw) will also change, thereby changing the value of P and the distribution of the amounts of power dissipated in the transistors (e.g., see Equation 2) and interconnects. This will, in turn, change the heat fields and corresponding temperatures within the chip.

In another embodiment of step 308, a transient analysis is performed, wherein the interdependence of temperature and average power in the semiconductor devices and interconnects is based on instantaneous values of power. In this case, power dissipated values are calculated by dynamically simulating the circuit embodied in the chip design under consideration. For example, the circuit may be simulated using any commercially available circuit simulator, such as HSPICE or HSIM, discussed above, or SPECTRE, commercially available from Cadence Design Systems. In one embodiment, the circuit is simulated by solving for values of electrical attributes (e.g., current and voltages) at various points in time. In the case of transient thermal analysis, the thermal analysis system (e.g., thermal analysis tool 200 of FIG. 2) drives the circuit simulator to calculate power at discrete points whenever there is a sufficient change in the temperature of the circuit. In one embodiment, the sufficiency of a temperature change for these purposes is determined by a predefined threshold.

In step 310, the method 300 distributes the power consumed in each of the interconnects. In one embodiment, power is distributed based on the resistance of the wires used in the interconnects, which is defined by the type, thickness and height of the wires used in the interconnects. In one embodiment, the resistance, $R_{interconnect}$, of an interconnect segment is calculated as:

$$R_{interconnect} = \frac{\rho L}{wt} \quad \text{(EQN. 6)}$$

where L is the length of the interconnect segment, w is the width of the segment, t is the thickness of the segment, and ρ is a resistivity constant dependent upon the type of wire used. The resistivity constant, ρ, may be found in tables included in any number of integrated circuits textbooks, including Rabaey et al., *Digital Integrated Circuits*, Second Edition, Prentice Hall Electronic and VLSI Series, 2002.

In step 312, the method 300 uses the power dissipation and distribution information calculated in steps 306–310 to model a full-chip (e.g., three-dimensional) temperature gradient over the chip design under consideration. In one embodiment, a full-chip temperature gradient is modeled by adaptively partitioning the volumes of steep temperature gradients over the chip design. In one embodiment, partitioning is done in three dimensions; however, in other embodiments, partitioning may be done in one or two dimensions as well (for example, vertical partitioning may be explicitly considered in how the temperature is modeled). In one embodiment, "steep" temperature gradients are those portions of the overall temperature gradient that are steep relative to other regions of the overall temperature gradient. In one embodiment, techfile data (e.g., pertaining to the dimensions and properties of the chip design layers) and power density data are used to partition the chip design. Power density data is typically contained within the power table provided for a particular state of operation of a chip design. The temperatures in each partition are then determined and annotated accordingly in the three-dimensional model.

In step 314, the method 300 determines whether the currently computed temperature for the chip design falls within a previously specified range. If the method 300 concludes that the currently computed temperature does not fall within this range, the method 300 proceeds to step 318 and modifies the chip design (e.g., by changing the resistances of the semiconductor devices and interconnects, resizing the semiconductor devices and interconnect wires, etc.). The method 300 then returns to step 308 and proceeds as discussed above.

Alternatively, if the method 300 determines that the currently computed temperature does fall within the specified range, the method 300 proceeds to step 316 and terminates. Thus, steps of the method 300 may be repeated in an iterative manner until a steady state value is reached, within a specified tolerance. In one embodiment, iteration of these steps may depend on the particular implementation of the method 300. In further embodiments, iteration could include convergence to an absolute value, convergence to a relative value, or the passing of a fixed number or iterations or a fixed amount of time.

Thus, the method 300 employs industry standard design, package and heat sink data in order to produce a more complete and more accurate profile of the temperature gradient created by a semiconductor chip design. By accounting for the distribution of power dissipated in the semiconductor devices and in the interconnects, rather than simply characterizing dissipated power as the power dissipated in the active semiconductor devices (which does not consider simultaneous changes in the electrothermal properties of the semiconductor devices and interconnects), more accurate, full-chip thermal profiling can be achieved.

Chip designers may use the full-chip data produced by the method 300 to design more robust semiconductor chips for particular applications. For example, if the full-chip temperature gradient produced by one iteration of the method 300 does not illustrate acceptable results for a semiconductor chip design, a chip designer may go back and modify the chip design (e.g., by changing the resistances of the semiconductor devices and interconnects, resizing the semiconductor devices and interconnect wires, etc.) in an attempt to achieve more desirable results. The method 300 may then be applied to the modified design to assess the resultant temperature gradient. Those skilled in the art will appreciate that while the method 300 illustrates a series of steps, the present invention is not limited to the particular sequence illustrated, and thus FIG. 3 should be considered only as one exemplary embodiment of the present invention.

The methods described herein with reference to the preceding Figures may also be implemented to advantage in the thermal testing phase of semiconductor chip development, e.g., to confirm that the thermal gradients calculated in the design phase do not, in operation, exceed the operational limits within which the semiconductor chip was designed.

Figure 5:
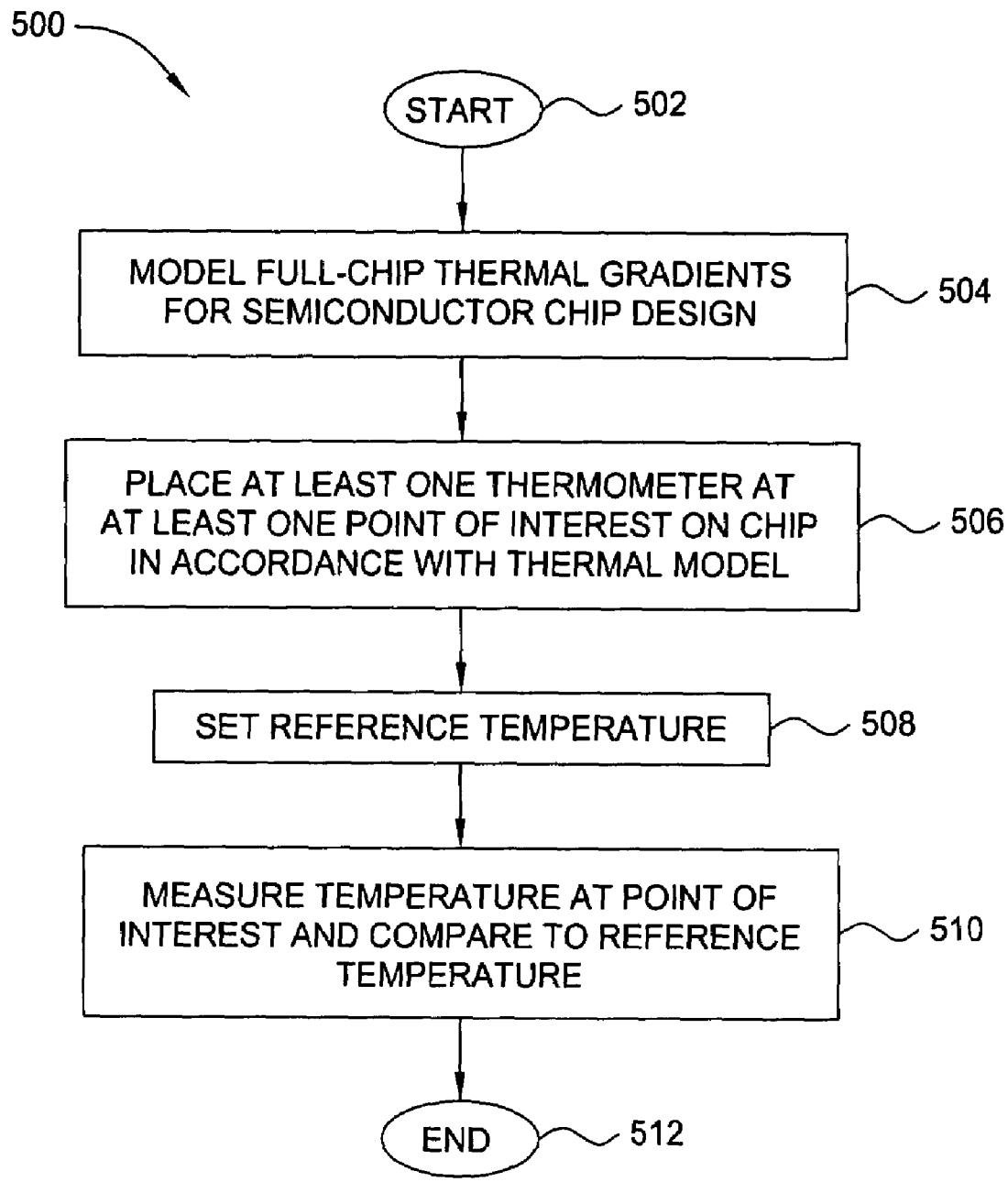
FIG. 5 is a flow diagram illustrating one embodiment of a method for testing temperatures in an operational semiconductor chip.

FIG. 5 is a flow diagram illustrating one embodiment of a method 500 for testing temperatures in an operational semiconductor chip (e.g., as opposed to a test chip). The method 500 is initialized at step 502 and proceeds to step 504, where the method models the full-chip thermal gradients for the semiconductor chip under consideration. In one embodiment, this full-chip thermal analysis is performed in accordance with the method 300 described with reference to FIG. 3.

In step 506, the method 500 identifies at least one point of interest (or multiple points of interest having a mutual temperature difference of interest) on the semiconductor chip, in accordance with the thermal model produced in step 504. In one embodiment, points of interest are those regions of the semiconductor chip in which the thermal gradients are observed to be the steepest (e.g., relative to other regions of the same semiconductor chip). At least one temperature sensor is then placed at each identified point of interest. One embodiment of a suitable temperature sensor structure for use in accordance with the method 500 is discussed in greater detail with respect to FIG. 6.

Once a temperature sensor has been placed at an identified point of interest, the method 500 proceeds to step 508 and sets a reference temperature for the temperature sensor. In one embodiment, the reference temperature is based on a maximum acceptable temperature value for the semiconductor chip (e.g., a temperature not to be exceeded in operation).

In step 510, the method 100 measures the current temperature at the point of interest, e.g., using the temperature sensor placed in step 508. The method 500 then compares this measured temperature to the reference temperature, e.g., to determine whether the operational temperature of the semiconductor chip is within acceptable limits. In one embodiment, both the reference temperature and the measured temperature are assessed as voltages, where the voltages are functions of temperature. In such an embodiment, the temperature sensor may be a circuit that measures the voltage at the point of interest.

The method 500 is terminated in step 512.

The method 500 greatly improves thermal testing of semiconductor chips. For instance, regions of steep thermal gradients within a semiconductor chip may be located for testing with a much greater degree of accuracy than is possible according to conventional methods, which place temperature sensors in random regions. Moreover, the method 500 may be implemented to test temperatures within an operating semiconductor chip, as opposed to a test chip. Thus, a semiconductor chip tested in accordance with the method 500 is much more likely to meet design standards than a semiconductor chip tested in accordance with conventional trial and error methods.

Figure 6:
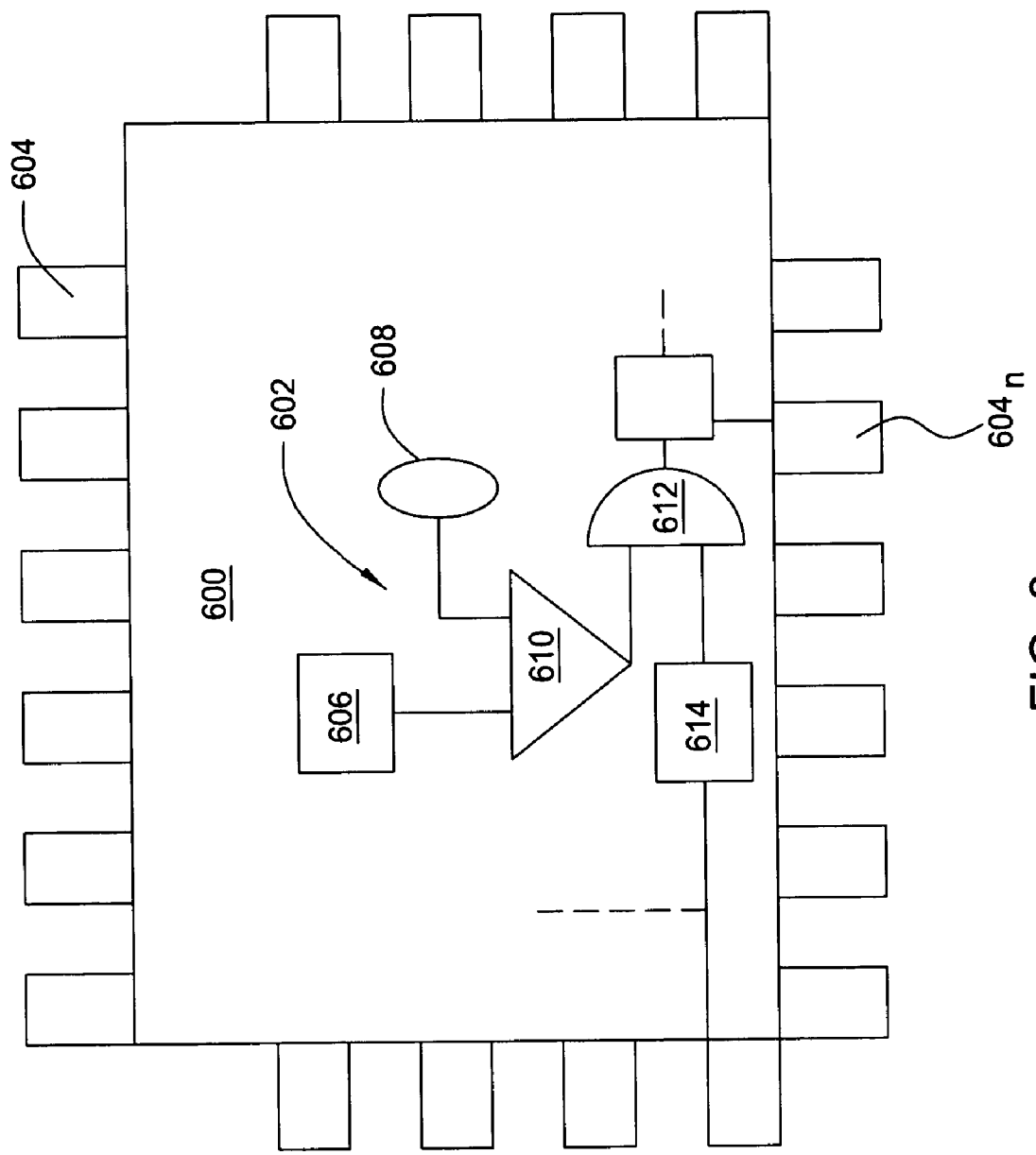
FIG. 6 is a schematic diagram illustrating one embodiment of a semiconductor chip having a temperature sensor deployed therein in accordance with the present invention.

FIG. 6 is a schematic diagram illustrating one embodiment of a semiconductor chip 600 having a temperature sensor 602 deployed therein in accordance with the present invention. In one embodiment, the semiconductor chip 600 is an operational semiconductor chip (e.g., not a test chip) having a plurality of pins 604 disposed about its periphery for testing purposes. In one embodiment, the operating temperatures of this semiconductor chip 600 may be tested in a manner that is similar to known methods used in the "design for test" (DFT) of digital integrated circuits, for example as described by John Knight, "Design Flow", Carlton University, Sep. 30, 2003 (e.g., where scan chains are used to probe the output of the temperature sensors).

In one embodiment, the temperature sensor 602 is a thermometer circuit comprising a thermometer 606, a reference voltage 608, a comparator 610, a logic gate 612 and a control circuit 614. The reference voltage 608 and the thermometer 606 are both configured to deliver their respective output to the comparator 610, which in turns provides output to the logic gate 612. In addition, the logic gate 612 receives output from the control circuit 614. Other exemplary embodiments of suitable temperature sensors that may be implemented in accordance with the present invention are described, for example, in the data sheet for the Stratix® II High-Speed Development Board, commercially available from Altera Corporation of San Jose, Calif. (see, e.g., p. 48).

As discussed above, the reference voltage 608 may be set to reflect the maximum acceptable temperature for the semiconductor chip 600 (e.g., where the reference voltage is a function of the maximum acceptable temperature). The thermometer 606 measures a voltage that is a function of the actual operating temperature of the semiconductor chip 600 in the location of interest/deployment. Both the reference voltage 608 and the measured voltage are then provided to the comparator 610, which assesses the difference between the two inputs (which will reflect, e.g., whether and by how much the operating temperature of the semiconductor chip 600 exceeds the maximum acceptable temperature).

The comparator 610 outputs a signal reflecting the voltage difference to the logic gate 612, whose state is set by the control circuit 614. In thermal testing mode, the control circuit 614 sets the logic gate state such that the logic gate 612 allows the signal from the comparator 610 to be scanned to a pin $604_n$ on the periphery of the semiconductor chip 600, thereby providing observable access points to the internal temperature sensor 602. If the signal from the comparator 610 indicates that the maximum acceptable temperature has been exceeded, this signal sets a logic value at the pin $604_n$. For example, the logic value at the pin $604_n$ may be a logical TRUE/FALSE (e.g., based on a convention) that indicates when the maximum acceptable temperature has been exceeded. In one embodiment, this logical TRUE/FALSE indicator may be used to alert a user to the fact that the maximum acceptable temperature has been exceeded. In normal operating mode, the logic gate 612 may be set by the control circuit 614 such that the pin $604_n$ is connected to signal lines within the semiconductor chip 600.

As discussed above, by placing the temperature sensor 602 within the operational semiconductor chip 600 (e.g., instead of within a test chip), more accurate run-time thermal information can be obtained for thermal testing and assessment. Moreover, this minimizes the overhead attributed to building temperature sensors into a semiconductor chip under test, because the temperature sensors are strategically placed in regions that are known to exhibit steep thermal gradients (and not simply assumed or guessed to exhibit these gradients).

Figure 7:
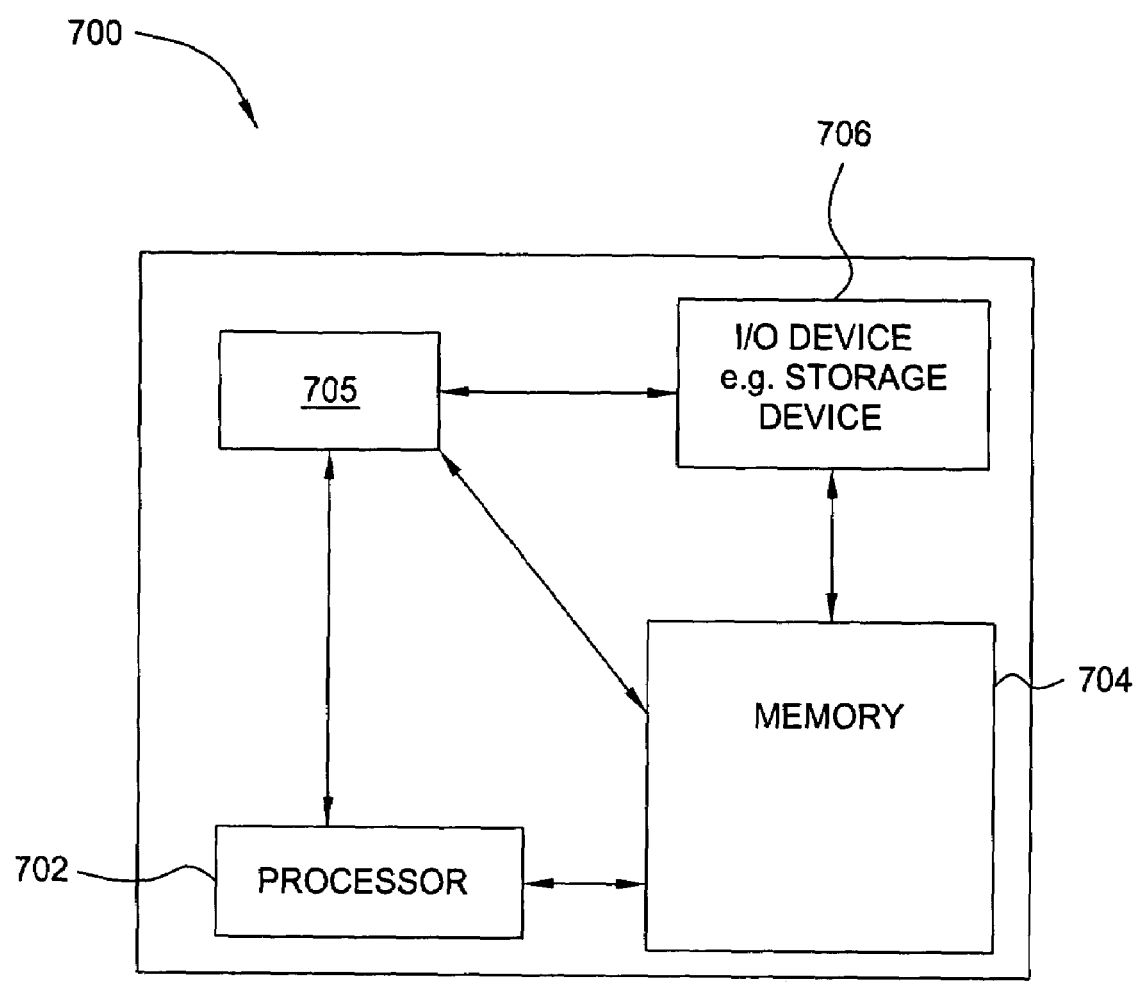
FIG. 7 is a high level block diagram of the present dynamic thermal analysis tool that is implemented using a general purpose computing device.

FIG. 7 is a high level block diagram of the present thermal testing tool that is implemented using a general purpose computing device 700. In one embodiment, a general purpose computing device 700 comprises a processor 702, a memory 704, a thermal testing module 705 and various input/output (I/O) devices 706 such as a display, a keyboard, a mouse, a modem, a network connection and the like. In one embodiment, at least one I/O device is a storage device (e.g., a disk drive, an optical disk drive, a floppy disk drive). It should be understood that the thermal testing module 705 can be implemented as a physical device or subsystem that is coupled to a processor through a communication channel.

Alternatively, the thermal testing module 705 can be represented by one or more software applications (or even a combination of software and hardware, e.g., using Application Specific Integrated Circuits (ASIC)), where the software is loaded from a storage medium (e.g., I/O devices 706) and operated by the processor 702 in the memory 704 of the general purpose computing device 700. Additionally, the software may run in a distributed or partitioned fashion on two or more computing devices similar to the general purpose computing device 700. Thus, in one embodiment, the thermal testing module 705 for thermal testing of semiconductor chip designs described herein with reference to the preceding figures can be stored on a computer readable medium or carrier (e.g., RAM, magnetic or optical drive or diskette, and the like).

Thus, the present invention represents a significant advancement in the field of semiconductor chip design. Embodiments of the present invention allow semiconductor chip developers to identify regions of steep thermal gradients in actual, operational semiconductor chips, and to monitor these identified regions to ensure that operating temperatures do not exceed acceptable limits. The disclosed methods are significantly more accurate than conventional trial and error methods for thermal testing of semiconductor chip designs, which place temperature sensors in random locations on test chips. Thus, semiconductor chip developers may accurately determine when operating temperature limits are exceeded by a semiconductor chip, and may adjust designs accordingly, e.g., by placing run-time constraints on a semiconductor chip or by designing improved chip packages.

While the foregoing is directed to embodiments of the invention, other and further embodiments of the invention may be devised without departing from the basic scope thereof, and the scope thereof is determined by the claims that follow.

What is claimed is:

1. A method for performing thermal testing of a semiconductor chip design, the semiconductor chip design including one or more semiconductor devices and one or more interconnects connecting the one or more semiconductor devices, the method comprising:

calculating full-chip temperatures over said semiconductor chip design in accordance with a three-dimensional full-chip thermal model that is adaptively partitioned in response to volumes of steep thermal gradients over the semiconductor chip design and that depicts computed temperatures over said semiconductor chip design with a resolution down to a level of individual ones of said one or more semiconductor devices and individual ones of said one or more interconnects;

identifying at least one region in said semiconductor chip design that is determined to exhibit a steep thermal gradient relative to other regions of the semiconductor chip design, in accordance with the calculated full-chip temperatures;

positioning at least one temperature sensor in a region of interest within a semiconductor chip, the region of interest being determined, at least in part, by the at least one region of the semiconductor chip design that is determined to exhibit a steep thermal gradient relative to other regions of the semiconductor chip design;

specifying a maximum temperature not to be exceeded by said semiconductor chip in operation; and determining whether a measured temperature within the region of interest exceeds said maximum temperature.

2. The method of claim 1, wherein said maximum temperature and said measured temperature are assessed as voltages that are functions of temperature.

3. The method of claim 1, further comprising:
delivering a signal indicative of a difference between said measured temperature and said maximum temperature to a pin positioned at a periphery of said semiconductor chip.

4. The method of claim 1, wherein said temperature sensor is at least one of: a thermometer circuit, a diode and a thermistor.

5. The method of claim 1, wherein said semiconductor chip is an operational semiconductor chip.

6. A computer readable medium containing an executable program for performing thermal testing of a semiconductor chip design, the semiconductor chip design including one or more semiconductor devices and one or more interconnects connecting the one or more semiconductor devices, where the program performs the steps of:
calculating full-chip temperatures over said semiconductor chip design in accordance with a three-dimensional full-chip thermal model that is adaptively partitioned in response to volumes of steep thermal gradients over the semiconductor chip design and that depicts computed temperatures over said semiconductor chip design with a resolution down to a level of individual ones of said one or more semiconductor devices and individual ones of said one or more interconnects;
identifying at least one region in said semiconductor chip design that is determined to exhibit a steep thermal gradient relative to other regions of the semiconductor chip design, in accordance with the calculated full-chip temperatures;
positioning at least one temperature sensor in a region of interest within a semiconductor chip, the region of interest being determined, at least in part, by the at least one region of the semiconductor chip design that is determined to exhibit a steep thermal gradient relative to other regions of the semiconductor chip design; specifying a maximum temperature not to be exceeded by said semiconductor chip in operation; and determining whether a measured temperature within the region of interest exceeds said maximum temperature.

7. The computer readable medium of claim 6, wherein said maximum temperature and said measured temperature are assessed as voltages that are functions of temperature.

8. The computer readable medium of claim 6, further comprising:
delivering a signal indicative of a difference between said measured temperature and said maximum temperature to a pin positioned at a periphery of said semiconductor chip.

9. The computer readable medium of claim 6, wherein said temperature sensor is at least one of: a thermometer circuit, a diode and a thermistor.

10. The computer readable medium of claim 6, wherein said semiconductor chip is an operational semiconductor chip.

11. Apparatus for performing thermal testing of a semiconductor chip design, the semiconductor chip design including one or more semiconductor devices and one or more interconnects connecting the one or more semiconductor devices, the apparatus comprising:
means for calculating full-chip temperatures over said semiconductor chip design in accordance with a three-dimensional full-chip thermal model that is adaptively partitioned in response to volumes of steep thermal gradients over the semiconductor chip design and that depicts computed temperatures over said semiconductor chip design with a resolution down to a level of individual ones of said one or more semiconductor devices and individual ones of said one or more interconnects;
means for identifying at least one region in said semiconductor chip design that is determined to exhibit a steep thermal gradient relative to other regions of the semiconductor chip design, in accordance with the calculated full-chip temperatures;
means for positioning at least one temperature sensor in a region of interest within a semiconductor chip, the region of interest being determined, at least in part, by the at least one region of the semiconductor chip design that is determined to exhibit a steep thermal gradient relative to other regions of the semiconductor chip design; mean for specifying a maximum temperature not to be exceeded by said semiconductor chip in operation; and mean for determining whether a measured temperature within the region of interest exceeds said maximum temperature.

* * * * *